United States Patent
Hirota et al.

(10) Patent No.: US 8,241,982 B2
(45) Date of Patent: Aug. 14, 2012

(54) SEMICONDUCTOR DEVICE MANUFACTURING METHOD

(75) Inventors: Yoshihiro Hirota, Amagasaki (JP); Yoshihiro Sato, Amagasaki (JP); Nobuo Okumura, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 21 days.

(21) Appl. No.: 12/942,057

(22) Filed: Nov. 9, 2010

(65) Prior Publication Data

US 2011/0073931 A1    Mar. 31, 2011

Related U.S. Application Data

(63) Continuation of application No. PCT/JP2009/058574, filed on May 1, 2009.

(30) Foreign Application Priority Data

May 9, 2008   (JP) .................................. 2008-123561

(51) Int. Cl.
   *H01L 21/336*   (2006.01)
(52) U.S. Cl. ........ 438/257; 438/704; 438/296; 438/359; 438/424
(58) Field of Classification Search .................. 438/257, 438/704, 694, E21.546, 296, 359, 424, 700
   See application file for complete search history.

(56) References Cited

U.S. PATENT DOCUMENTS

| | | | |
|---|---|---|---|
| 7,300,838 B2 * | 11/2007 | Koike et al. .................. 438/216 |
| 7,884,414 B2 * | 2/2011 | Watanabe ...................... 257/316 |
| 7,906,804 B2 * | 3/2011 | Akahori et al. ................ 257/316 |
| 7,927,949 B2 * | 4/2011 | Ozawa et al. .................. 438/257 |
| 7,972,923 B2 * | 7/2011 | Park et al. .................... 438/257 |
| 8,133,782 B2 * | 3/2012 | Akahori et al. ................ 438/257 |
| 2005/0002231 A1 * | 1/2005 | Ozawa et al. ............. 365/185.01 |
| 2005/0029578 A1 * | 2/2005 | Nishizaka ...................... 257/315 |
| 2006/0051921 A1 * | 3/2006 | Youn et al. .................... 438/257 |
| 2006/0054957 A1 * | 3/2006 | Ozawa et al. .................. 257/296 |
| 2006/0060927 A1 * | 3/2006 | Ozawa et al. .................. 257/390 |
| 2006/0166446 A1 | 7/2006 | Sasaki et al. |
| 2006/0240619 A1 * | 10/2006 | Ozawa et al. .................. 438/257 |

FOREIGN PATENT DOCUMENTS

| | | |
|---|---|---|
| JP | 5-267684 A | 10/1993 |
| JP | 6-77493 A | 3/1994 |
| JP | 10-163348 A | 6/1998 |
| JP | 2001-176839 A | 6/2001 |
| JP | 2005-26590 A | 1/2005 |
| JP | 2007-5696 A | 1/2007 |

OTHER PUBLICATIONS

International Search Report for International Application No. PCT/JP2009/058574, mailed Aug. 11, 2009.

* cited by examiner

*Primary Examiner* — Marcos D. Pizarro
*Assistant Examiner* — Bilkis Jahan
(74) *Attorney, Agent, or Firm* — Nath, Goldberg & Meyer; Jerald L. Meyer

(57) ABSTRACT

A plasma nitriding process is followed by a selective etching process which removes a silicon oxynitride film formed on surfaces of both an element separation film and an insulation film while leaving a silicon nitride film formed on an electrode layer. The selective etching process removes the silicon oxynitride film formed on the surfaces of the element separation film and the insulation film.

10 Claims, 14 Drawing Sheets

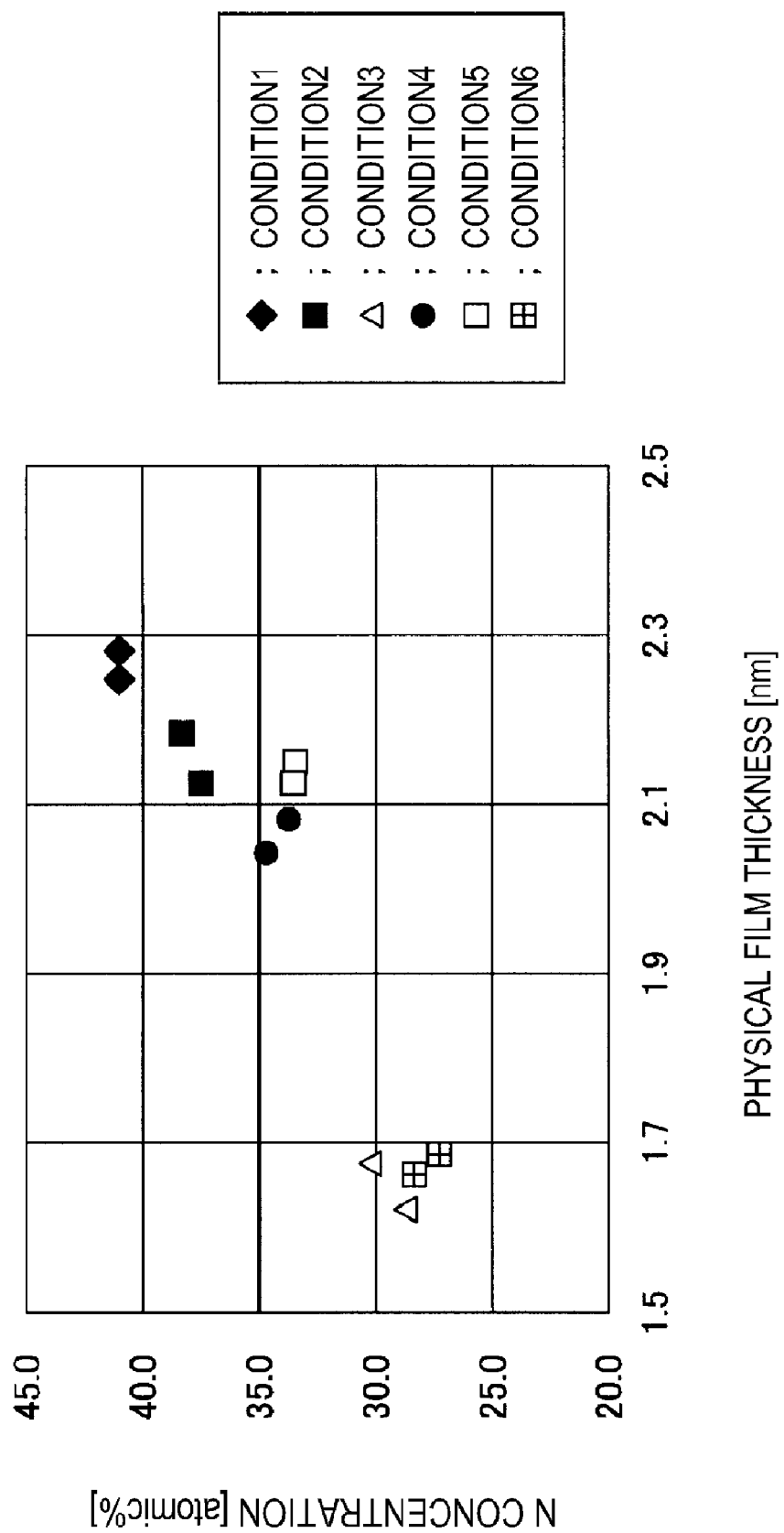

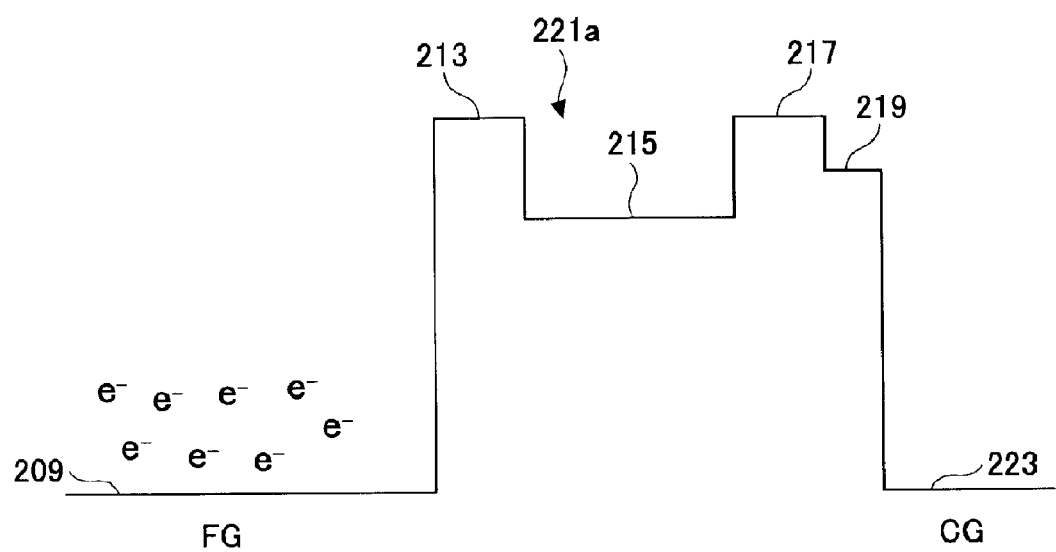

SEMICONDUCTOR DEVICE MANUFACTURING METHOD

CROSS-REFERENCE TO RELATED APPLICATIONS

This application is a Continuation application of PCT International Application No. PCT/JP2009/058574, filed May 1, 2009, which claimed the benefit of Japanese Patent Application No. 2008-123561, filed May 9, 2008, the entire content of each of which is hereby incorporated by reference.

FIELD OF THE INVENTION

The present invention relates to a method of manufacturing a semiconductor device.

BACKGROUND OF THE INVENTION

Flash memory has advantages such as having a small cell size, a large memory capacity and a high collision resistance. Thus, in recent years, the demand for flash memory has rapidly increased. A typical flash memory includes a control gate electrode and a floating gate electrode that make a pair. Electrons are injected into the floating gate electrode when data is being written, while electrons are discharged from the floating gate electrode when data is being erased. Such flash memory further includes an insulation film covering the floating gate electrode. The insulation film prevents the leakage of electrons injected into the floating gate electrode. Thus, the flash memory is capable of storing data for a long time insofar as electrical power is not supplied thereto.

If the insulation film covering the floating gate electrode, for example a tunnel insulation film, an interlayer capacitance film having an ONO (Oxide-Nitride-Oxide) structure, etc. is thickened, it is difficult for electrons to leak from the floating gate electrode and a data holding characteristic of a flash memory can be thereby enhanced. Thickening the insulation film covering the floating gate electrode, however, leads to a fall in efficiency of injecting and discharging of electrons into and from the floating gate electrode, thereby deteriorating data writing characteristics and data erasing characteristics.

Further, when the control gate electrode is formed by etching during the manufacture of flash memory, side walls of the floating gate electrode, which is composed of multicrystllaine silicon, are exposed. For this reason, a process for covering the side walls with an oxide film by heat treatment is performed. However, the tunnel insulation film or the interlayer capacitance film having an ONO structure is oxidized and thickened due to such heat treatment, thereby causing a problem where the efficiency of injecting and discharging electrons into and from the floating gate electrode deteriorates. In order to solve the aforementioned problem, a technique has been suggested wherein a silicon oxide film is formed on a surface of the floating gate electrode by ion-implanting nitrogen to the floating gate electrode after forming the floating gate electrode and then heat treating at a temperature of 800° C. or more, thereby segregating nitrogen at an interface between the floating gate electrode and the interlayer capacitance film and the tunnel insulation film (that is, a silicon nitride film is formed). (see Patent Document 1)

Patent Document 1: Japanese Patent No. 3312102

When forming a silicon nitride film by ion-implanting nitrogen to the floating gate electrode as suggested in the above-mentioned Patent Document 1, it is possible to form a silicon nitride film wherein nitrogen is segregated only in the interface between the floating gate electrode and the insulation film. However, in the technique suggested in the above-mentioned Patent Document 1, heat treatment after implanting nitrogen is indispensable. Accordingly, the aforementioned heat treatment is disadvantageous in that the thermal budget increases and the distribution of implanted nitrogen is difficult to precisely control.

Meanwhile, it is known in the art to use plasma nitridation as a means of forming a silicon nitride film by thinly introducing nitrogen to a surface of a silicon layer. This may be applied to nitridation of the floating gate electrode. The plasma nitridation is advantageous in that the nitrogen distribution is easily controlled when compared to the method of heat treating after implanting nitrogen as suggested in the above Patent Document 1. Further, use of plasma allows for nitridation at a low temperature of, for example, 400° C.~600° C., thereby eliminating all problems caused by heat treatment at a high temperature of 800° C. or more, which is suggested in the above Patent Document 1. However, selective nitridation is difficult in the plasma nitriding process. That is, since all exposed surfaces of a target object to be processed are nitrided, a part not needing to be nitrided is also formed with a nitrogen-containing layer. If an unnecessary nitrogen-containing layer remains in the flash memory, it may lead to degraded performance of the flash memory, for example, the occurrence of electrical interference between neighboring cells via the remaining nitrogen-containing layer.

For example, when forming a silicon nitride film on a surface of a floating gate electrode of a flash memory, if the plasma nitridation is performed after forming a floating gate electrode on a silicon substrate, not only is the surface of the floating gate electrode nitrided, but the element separation film separating neighboring cells are also nitrided and a silicon oxynitride film is formed thereon. As a result, an originally unnecessary nitrogen-containing layer (silicon oxynitride film) remains on the element separation film of the finished flash memory. This remaining unnecessary silicon oxynitride film may cause electrical interference between neighboring cells to thereby deteriorate a data holding characteristic of the flash memory.

SUMMARY OF THE INVENTION

The present invention has been made in light of the foregoing. It is therefore an object of the present invention to provide a method of manufacturing a semiconductor device, which does not leave a nitrogen-containing layer formed by plasma nitridation, during the manufacture of various semiconductor devices, to a part not needing such a nitrogen-containing layer.

According to a first aspect of the present invention, there is provided a method of manufacturing a semiconductor device, wherein an element separation film containing oxygen demarcates a field region and an active region, the semiconductor device having an electrode layer and a nitrogen-containing layer being in contact with the electrode layer in the active region. The method comprises: applying, through plasma nitriding, a nitrogen-containing plasma to an exposed surface of the electrode layer and an exposed surface of the element separation film to form a nitrogen-containing layer on the surface of the electrode layer and the surface of the element separation film respectively; and selectively etching to selectively remove the nitrogen-containing layer formed on the surface of the element separation film while leaving the nitrogen-containing layer formed on the surface of the electrode layer.

According to a second aspect of the present invention, there is provided a method according to the first aspect, wherein the electrode layer comprises polysilicon as a main component and the nitrogen-containing layer formed on the electrode layer is silicon nitride.

According to a third aspect of the present invention, there is provided a method according to the first or second aspect, wherein the element separation film comprises silicon oxide as a main component and the nitrogen-containing layer formed on the element separation film is silicon oxynitride.

According to a fourth aspect of the present invention, there is provided a method according to any one of the first to third aspects, wherein when selectively etching, wet etching is performed using dilute hydrofluoric acid solution.

According to a fifth aspect of the present invention, there is provided a method according to any one of the first to fourth aspects, wherein, when plasma nitriding, a nitrogen concentration of the nitrogen-containing layer formed on the electrode layer is in a range of not less than 35 atomic % and not more than 45 atomic %.

Further in some embodiments, it is preferred in the method of manufacturing a semiconductor device that the electrode layer is a floating gate electrode of a nonvolatile memory and the silicon nitride film is a part of an interlayer capacitance film intervening between the floating gate electrode and a control gate electrode.

According to a sixth aspect of the present invention, there is provided a method according to any one of the first to fifth aspects, wherein the electrode layer is a floating gate electrode of a nonvolatile memory, and the silicon nitride film is a part of an interlayer capacitance film intervening between the floating gate electrode and a control gate electrode.

The method of manufacturing a semiconductor device according to some embodiments of the present invention is capable of selectively removing the unnecessary nitrogen-containing layer formed on the surface of the element separation film while leaving the nitrogen-containing layer formed on the electrode layers by forming the nitrogen-containing layer on the surfaces of both the electrode layer and the element separation film respectively through the plasma nitridation and then selectively etching.

Accordingly, a semiconductor device, which is manufactured by the manufacturing method according to some embodiments of the present invention, can prevent adverse effects caused by unnecessary nitrogen-containing layers, such as electrical interference between neighboring cells, and can enhance reliability.

BRIEF DESCRIPTION OF THE DRAWINGS

FIG. 3 is a graph showing the relationship between a nitrogen concentration (atomic %) in a nitrogen-containing layer and a physical film thickness.

FIG. 10B is a barrier height diagram in a flash memory manufactured by the method of manufacturing a semiconductor device according to an embodiment of the present invention.

DETAILED DESCRIPTION OF THE EMBODIMENTS

A detailed description may be provided with reference to the accompanying drawings. One of ordinary skill in the art may realize that the following description is illustrative only and is not in any way limiting. Other embodiments of the present invention may readily suggest themselves to such skilled persons having the benefit of this disclosure.

[First Embodiment]

Figure 1A:
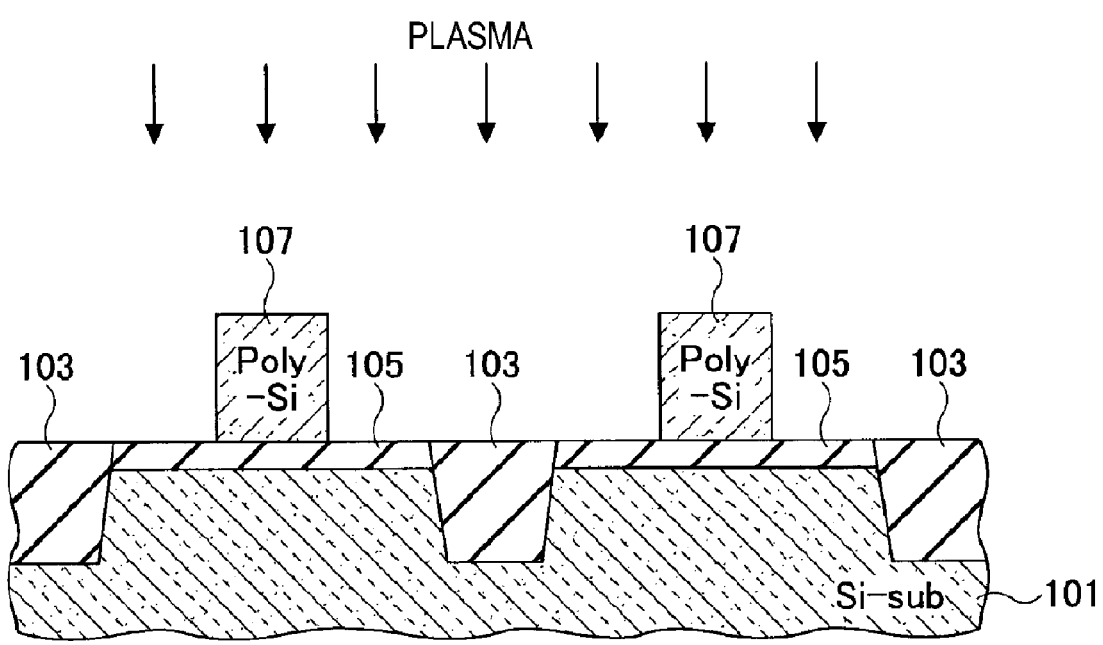
FIG. 1A illustrates one main process of a method of manufacturing a semiconductor device according to a first embodiment of the present invention.
Figure 1B:
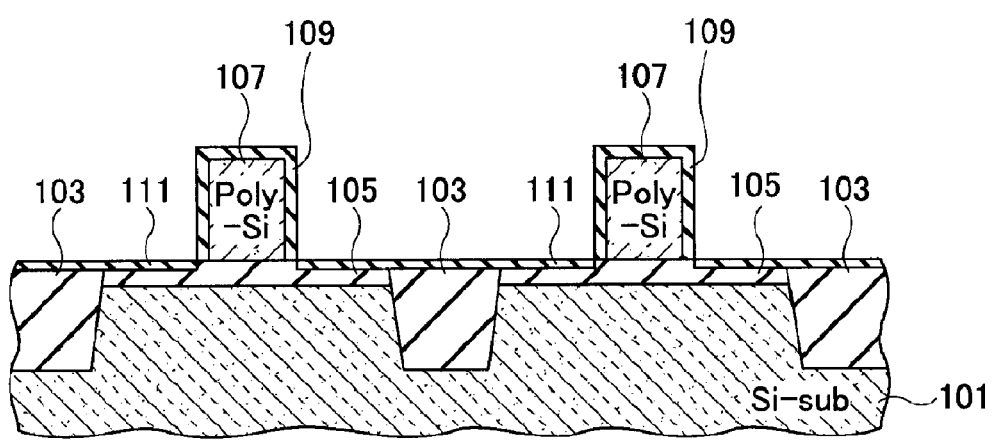
FIG. 1B illustrates a further main process of the method of manufacturing a semiconductor device according to the first embodiment of the present invention.
Figure 1C:
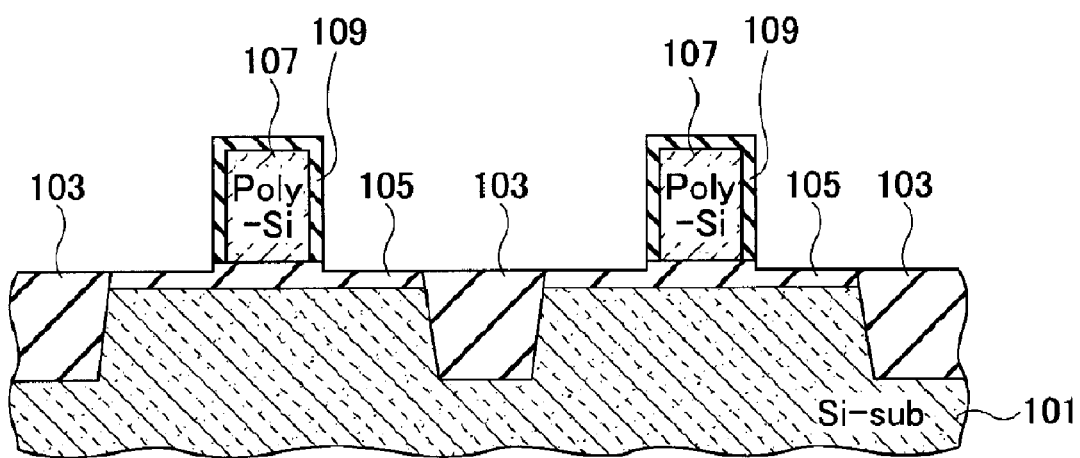
FIG. 1C illustrates another main process of the method of manufacturing a semiconductor device according to the first embodiment of the present invention.

FIGS. 1A to 1C illustrate parts of a semiconductor manufacturing processes according to this embodiment, respectively. As shown in FIG. 1A, concave portions (trenches) are formed on a silicon substrate 101 by, for example, an STI (Shallow Trench Isolation) method. An element separation film 103, which is substantially composed of silicon dioxide ($SiO_2$), is buried in the concave portion to separate an active region and a field region. Further, an insulation film 105, which is composed of silicon dioxide ($SiO_2$), is formed on a surface of the silicon substrate 101. An electrode layer 107, which is substantially composed of polysilicon, is formed and patterned on the insulation film.

A method of manufacturing a semiconductor device according to this embodiment includes: a plasma nitriding process for forming a nitrogen-containing layer on each of the surfaces of the electrode layer 107 and the element separation film 103 by applying a nitrogen-containing plasma to the silicon substrate 101, on which the electrode layer 107 and the element separation film 103 are exposed; and a selective etching process for selectively removing a nitrogen-containing layer formed on the surface of the element separation film 103 while leaving a nitrogen-containing layer formed on the surface of the electrode layer 107. FIG. 1A shows the silicon substrate 101 with its surface under the plasma nitridation, while FIG. 1B shows the silicon substrate 101 after the plasma nitridation. A silicon nitride (SiN) film 109 is formed on the surface of the electrode layer 107 as a nitrogen-containing layer through plasma nitridation. However, since the silicon substrate 101 is exposed to plasma having high ion energy during the plasma nitridation, the surfaces of both the element separation film 103 and the insulation film 105 are also nitrided, and thus a silicon oxynitride film (SiON) 111 is formed on the surfaces of the element separation film 103 and the insulation film 105 as a nitrogen-containing layer. As such, the plasma nitridation cannot avoid nitriding not only the polysilicon of the electrode layer 107 (that is a target object to be nitrided), but also the silicon dioxide of the element separation film 103 and the insulation film 105 (that is not a target object to be nitrided).

The unnecessary silicon oxynitride film 111, which is formed on the surfaces of the element separation film 103 and the insulation film 105 as shown in FIG. 1B, can be removed in a subsequent process or can finally remain in a semiconductor device (e.g., MOSFET) without removal. Silicon oxynitride (SiON) has a great number of defects such as a hole when compared to dense silicon dioxide ($SiO_2$). Thus, it is prone to act as a path passing electrons therethrough. That is, electrons leak into neighboring cells through electrical defects residing in the remaining silicon oxynitride film 111, thereby deteriorating the performance of a semiconductor device.

Accordingly, the method of manufacturing a semiconductor device according to this embodiment includes a selective etching process after the plasma nitriding process, thereby removing the silicon oxynitride film 111 formed on the surfaces of the element separation film 103 and the insulation film 105 while leaving the silicon nitride film 109 formed on the electrode layer 107. As shown in FIG. 1C, the selective etching process removes the silicon oxynitride film 111 formed on the surfaces of the element separation film 103 and the insulation film 105. Removing the unnecessary silicon oxynitride film 111 can prevent adverse effects on the semiconductor device (for example, electrical interference between neighboring cells), which can occur due to the remaining silicon oxynitride film 111, which allows for the manufacture of a semiconductor device with high reliability.

It is preferred in some embodiments that the selective etching process is performed just after the plasma nitriding process or at least before a subsequent process accompanying heating. If a process accompanying heating is performed as the remaining silicon oxynitride film 111 remains, nitrogen atoms in the silicon oxynitride film 111 diffuse into the element separation film 103 and the insulation film 105. Further, an effective thickness of the element separation film 103 and the insulation film 105 decreases and functions thereof are lowered.

The selective etching process in this embodiment utilizes differences in solubility of silicon nitride (SiN) and silicon oxynitride (SiON) to etching liquid. A wet etching condition and a plasma nitriding process condition are taken into account as principal factors affecting selectivity of the selective etching.

(1) Wet Etching Condition

Wet etching may preferably in some embodiments use dilute hydrofluoric acid (DHF) that dissolves silicon oxide, but has difficulty dissolving silicon nitride. A concentration of dilute hydrofluoric acid to be used may depend upon the thickness of the nitrogen-containing layer. For example, it may be in the range of not less than 0.07% and not more than 1%. In other embodiments, it may be in the range of not less than 0.1% and not more than 0.3%. Further, the processing time associated with dilute hydrofluoric acid may depend upon the thickness of the nitrogen-containing layer or the concentration of the dilute hydrofluoric acid. It may be in the range of 10 seconds or more, in other embodiments not less than 30 seconds and not more than 300 seconds, and in alternate embodiments not less than 150 seconds and not more than 210 seconds. This processing time in some embodiments is selected such that the silicon oxynitride film 111 is removed and the silicon nitride film 109 can remain as much as possible (that is, considering the time margin).

(2) Plasma Nitridation Condition

The plasma nitridation preferably employs a method wherein electron temperature of plasma formed on the surface of a wafer is not less than 0.7 eV and not more than 2 eV, a thickness (depth) is in the range of several nanometers (for example, not less than 2 nm and not more than 5 nm), and nitrogen can be introduced by a relatively high concentration over a certain level (for example, not less than 35 atomic % and not more than 40 atomic %). In the aforementioned terms, a plasma processing apparatus is used in the plasma nitridation of this embodiment, wherein a microwave is introduced into a processing chamber through a planar antenna having a plurality of slots (for example, a radial line slot antenna (RLSA)) to generate a microwave-excited plasma. Further, a plasma processing apparatus of an inductively coupled plasma (ICP) method may be used in the plasma nitridation.

Next, the plasma nitridation will be described. First, a wafer W with the electrode layer 107 and the element separation film 103 formed thereon is prepared and conveyed into a plasma processing apparatus. Next, an inert gas and a nitrogen-containing gas are introduced at a predetermined flow rate from a gas supplying mechanism into a chamber of the plasma processing apparatus respectively, while the chamber is exhausted and depressurized. By doing so, the inside of the chamber is adjusted to a predetermined pressure.

Subsequently, a microwave, which is generated by a microwave generating apparatus and has a predetermined frequency (for example, 2.45 GHz), is supplied to a planar antenna through a matching circuit and a waveguide. The microwave, which is irradiated from the planar antenna through a transmitting plate into the chamber, excites plasma of the inert gas and the nitrogen-containing gas. The microwave-excited plasma has a high density of $1 \times 10^{10} \sim 5 \times 10^{12}/\text{cm}^3$ and a low electron temperature of about 1.2 eV or less in the vicinity of the wafer W. Such a microwave-excited plasma having a high density inflicts little plasma damage caused by ions to a base film. The plasma nitriding process is performed on the electrode layer 107 and the element separation film 103 formed on the surface of the wafer W by means of active species in the plasma such as ions or radicals.

It is preferred in some embodiments that a gas including a rare gas and a nitrogen-containing gas is used as a processing gas of the plasma nitridation. It is preferred in these embodiments that an Ar gas is used as the rare gas and an $N_2$ gas is used as the nitrogen-containing gas. In such a case, a volumetric flow rate ratio of the $N_2$ gas to the whole processing gas is in the range of preferably not less than 1% and not more than 90%, more preferably not less than 2% and not more than 20% in light of making a nitrogen concentration in the silicon oxynitride film 111 (FIG. 1B) high. For example, when processing a wafer W having a diameter of 200 mm or more, the flow rate ratio can be set such that a flow rate of the Ar gas is in the range of not less than 200 mL/min (sccm) and not more than 2000 mL/min (sccm) and a flow rate of the $N_2$ gas is in the range of not less than 10 mL/min (sccm) and not more than 2000 mL/min (sccm).

Further, the pressure in the chamber of the plasma processing apparatus during the plasma nitridation is in the range of preferably not less than 1.3 Pa and not more than 667 Pa, more preferably not less than 13.3 Pa and not more than 400 Pa, in light of strengthening ionicity of the plasma and making the nitrogen concentration of the nitrogen-containing layer high.

Further, a power density of the microwave is preferably in the range of not less than 1.4 W/cm$^2$ and 7 W/cm$^2$ in order to stably maintain the plasma. Further, the power density of the microwave means a microwave power supplied per a unit area 1 cm$^2$ of the transmitting plate (hereinafter, it means the same). For example, when processing a wafer W having a diameter of 200 mm or more, the microwave power is in the range of not less than 1000 W and not more than 5000 W.

Further, a heating temperature of a wafer W is set in the range of preferably not less than 200° C. and not more than 600° C., more preferably not less than 400° C. and not more than 500° C. as a temperature of a mounting table that is provided in the chamber to mount the wafer W thereon.

After the plasma nitridation is finished through the above-described procedures, the nitrided wafer W is conveyed out of the plasma processing apparatus.

Next, it will be described with reference to FIGS. 2 and 3 how the conditions of the plasma nitridation affect the selective etching. First, a sample "$SiO_2$", a sample "a-Si" and a sample "Poly-Si", wherein a silicon dioxide film ($SiO_2$), an amorphous silicon film (a-Si) and a polysilicon film (Poly-Si) are deposited on a silicon substrate respectively, were prepared. Thicknesses of those films were in the range of not less than 20 nm and not more than 30 nm. Further, a silicon substrate without any deposited film (Bare-Si) was also prepared as a sample "Bare-Si".

Subsequently, the plasma nitridation was performed for each of the samples under different conditions and a nitrogen-containing layer was formed on a surface of each sample. Conditions of the plasma nitridation are as follows.

[Common Conditions]
Temperature of Mounting Table: 500° C.
Microwave Power: 1500 W
Microwave Power Density: 2.1 W/$cm^2$ (per a unit area 1 $cm^2$ of a transmitting plate)
[Condition 1]
Ar Gas Flow Rate: 1000 mL/min (sccm)
$N_2$ Gas Flow Rate: 200 mL/min (sccm)
Flow Rate Ratio of $N_2$ (Percentage of $N_2$/Ar+$N_2$): 16.7%
Processing Pressure: 20 Pa
Processing Time: 90 seconds
[Condition 2]
Ar Gas Flow Rate: 1000 mL/min (sccm)
$N_2$ Gas Flow Rate: 200 mL/min (sccm)
Flow Rate Ratio of $N_2$ (Percentage of $N_2$/Ar+$N_2$): 16.7%
Processing Pressure: 20 Pa
Processing Time: 30 seconds
[Condition 3]
Ar Gas Flow Rate: 980 mL/min (sccm)
$N_2$ Gas Flow Rate: 20 mL/min (sccm)
Flow Rate Ratio of $N_2$ (Percentage of $N_2$/Ar+$N_2$): 2%
Processing Pressure: 20 Pa
Processing Time: 30 seconds
[Condition 4]
Ar Gas Flow Rate: 980 mL/min (sccm)
$N_2$ Gas Flow Rate: 20 mL/min (sccm)
Flow Rate Ratio of $N_2$ (Percentage of $N_2$/Ar+$N_2$): 2%
Processing Pressure: 67 Pa
Processing Time: 60 seconds
[Condition 5]
Ar Gas Flow Rate: 980 mL/min (sccm)
$N_2$ Gas Flow Rate: 20 mL/min (sccm)
Flow Rate Ratio of $N_2$ (Percentage of $N_2$/Ar+$N_2$): 2%
Processing Pressure: 127 Pa
Processing Time: 90 seconds
[Condition 6]
Ar Gas Flow Rate: 980 mL/min (sccm)
$N_2$ Gas Flow Rate: 20 mL/min (sccm)
Flow Rate Ratio of $N_2$ (Percentage of $N_2$/Ar+$N_2$): 2%
Processing Pressure: 400 Pa
Processing Time: 120 seconds The wet etching was performed in a manner that each sample with a nitrogen-containing layer (SiN film, SiON film) formed thereon was immersed in a dilute hydrofluoric acid (DHF) solution of 0.125 volume %. An etching time was 60 seconds, 180 seconds and 300 seconds. A nitrogen concentration in the nitrogen-containing layer was measured by an XPS (X-ray Photoelectron Spectroscopy) method after the wet etching. Regarding a relationship between a nitrogen concentration (atomic %) of each nitrogen-containing layer and an etching time, FIG. 2A shows results from the plasma nitridation conducted under condition 1 and FIG. 2B shows results from the plasma nitridation conducted under condition 2.

Figure 2A:
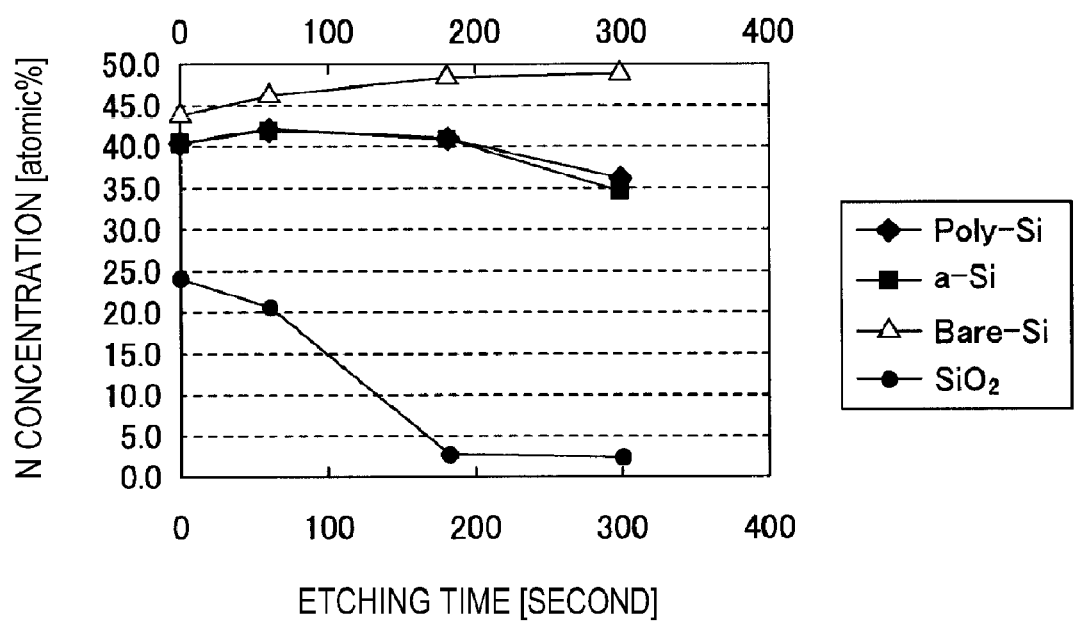
FIG. 2A is a graph showing the relationship between a nitrogen concentration (atomic %) in a nitrogen-containing layer and an etching time.
Figure 2B:
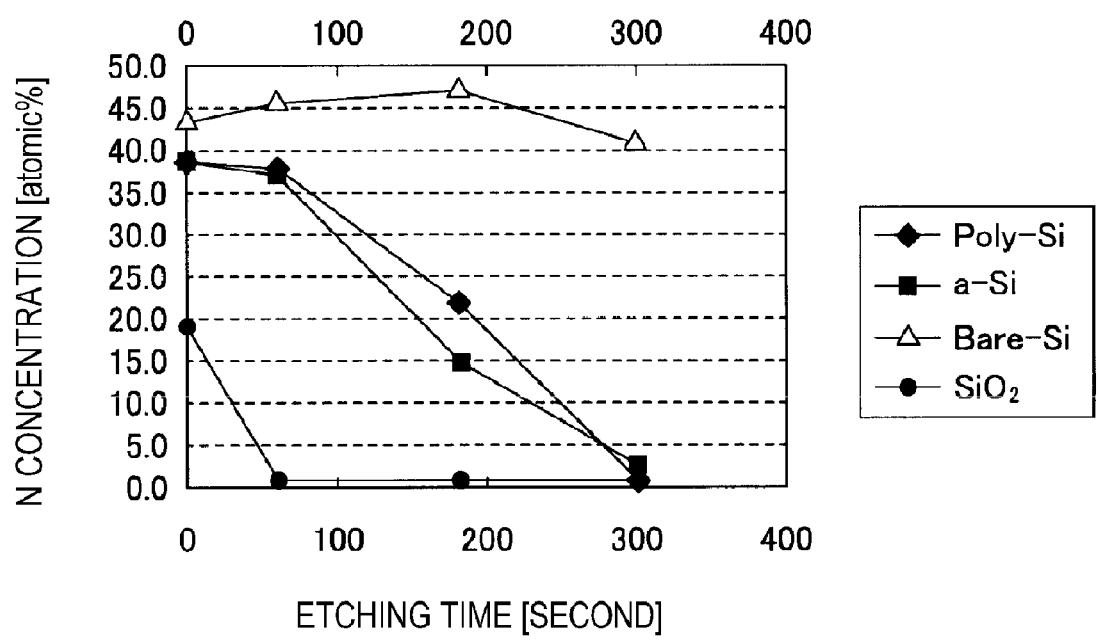
FIG. 2B is another graph showing the relationship between a nitrogen concentration (atomic %) in a nitrogen-containing layer and an etching time.

It can be seen from FIGS. 2A and 2B that etching rates of the samples "Poly-Si", "a-Si" and "Bare-Si" wherein silicon was nitrided are greatly different from the etching rate of the sample "$SiO_2$" wherein silicon dioxide was nitrided. When attention is made to the sample "$SiO_2$", the nitrogen concentration thereof becomes nearly zero at 180 seconds in FIG. 2A and 60 seconds in FIG. 2B and therefore the nitrogen-containing layer (silicon oxynitride film) is removed. By contrast, as for the sample "Poly-Si", the sample "a-Si" and the sample "Bare-Si" wherein silicon was nitrided, the nitrogen concentration hardly reduces at the same etching time and most of the nitrogen-containing layer (silicon nitride film) remains. Accordingly, it can be seen that the silicon oxynitride film was selectively removed.

Further, when comparing the plasma nitridation conducted under condition 1 in FIG. 2A and the plasma nitridation conducted under condition 2 in FIG. 2B, FIG. 2A shows that the nitrogen concentrations of the sample "Poly-Si", the sample "a-Si" and the sample "Bare-Si" (wherein silicon was nitrided) is preferable in terms of selective etching for leaving silicon nitride film without a decrease in spite of a long etching time. Since the plasma nitridation is performed for 90 seconds at a relatively low pressure of 20 Pa according to condition 1, the nitrogen concentration at the time of starting etching exceeds 40 atomic % in all of the sample "Poly-Si", the sample "a-Si" and the sample "Bare-Si" as shown in FIG. 2A. By contrast, when plasma nitridation is conducted under condition 2, the nitrogen concentrations of both the sample "Poly-Si" and the sample "a-Si" at the time of starting etching were less than 40% as shown in FIG. 2B.

It is, in some embodiments, preferably considered from the foregoing to select the plasma nitridation conditions capable of making the nitrogen concentration in the films as high as possible (for example, increasing the nitrogen ion concentration in the plasma or increasing the electron temperature) for the purpose of preventing, as much as possible, a reduction in the nitrogen concentration in the remaining silicon nitride film after etching. For further examination on the above matter, FIG. 3 shows the relationship between the nitrogen concentration in the films at the time of starting etching and a physical film thickness of the nitrogen-containing layer at the time of finishing etching (at the time when the nitrogen concentration of the sample "$SiO_2$" becomes nearly zero) with respect to the samples "Poly-Si" and "a-Si" for which the plasma nitridation was conducted under the conditions 1 to 6.

It is, in some embodiments, preferably considered from FIG. 3 that the nitrogen concentration in the nitrogen-containing layer is set to 35 atomic % or more (for example, not less than 35 atomic % and not more than 45 atomic %, preferably not less than 40 atomic % and not more than 45 atomic %) through the plasma nitridation in order to sufficiently ensure the film thickness of the nitrogen-containing layer (the silicon nitride films of the sample "Poly-Si" and the sample "a-Si") that remain at the time of finishing selectively etching.

In order to achieve high selectivity of the wet etching by making the nitrogen concentration in the silicon nitride film high, it is, in some embodiments, considered based on the above-explained results the following: the pressure of the plasma nitridation is set to, for example, the range of not less than 13.3 Pa and not more than 400 Pa; the processing time is set to, for example, to the range of not less than 30 seconds and not more than 240 seconds; and the flow rate ratio of the nitrogen gas is set to a range of not less than 1% and not more than 20%.

Further, a plasma processing apparatus of an ICP method may be used instead of the plasma processing apparatus of an RLSA method in the plasma nitridation. When using a plasma processing apparatus of an ICP method, it is preferred, in some embodiments, that a frequency of a high frequency electrical power is in the range of not less than 400 kHz and not more than 60 MHz or less (for example, 13.56 MHz) and a high frequency power is in the range of not less than 50 W and not more than 2000 W. Further, it is preferred, in some embodiments, that a processing temperature (temperature of a mounting table) is in the range of not less than 100° C. and not more than 600° C. and a processing pressure is in the range of not less than 0.13 Pa and not more than 667 Pa. Ar gas and $N_2$ gas are preferably used, in some embodiments, as a processing gas. A flow rate of the Ar gas is preferably, in some embodiments, in the range of not less than 100 mL/min (sccm) and not more than 2000 mL/min (sccm). A flow rate of the $N_2$ gas is preferably, in some embodiments, in the range of not less than 1 mL/min (sccm) and not more than 500 mL/min (sccm). For example, the plasma nitridation was performed using the plasma processing apparatus of an ICP method under conditions of the following: a frequency of a high frequency electrical power 13.56 MHz; a high frequency power 500 W; a processing temperature 400° C.; a processing pressure 6.7 Pa; a flow rate of Ar gas 1000 mL/min (sccm); and a flow rate of $N_2$ gas 50 mL/min (sccm). Then, the selective etching was performed under the same condition as described above. As a result, unnecessary nitrogen-containing layers (silicon oxynitride films) could be selectively removed. Accordingly, like the plasma processing apparatus of an RLSA method, the plasma processing apparatus of an ICP method can be also applied to the semiconductor device manufacturing method according to this embodiment.

As described above, the semiconductor device manufacturing method according to this embodiment can prevent adverse effects caused by unnecessary remaining nitrogen-containing layers such as electrical interference between neighboring cells and can manufacture semiconductor devices having excellent reliability.

[Second Embodiment]

Figure 4:
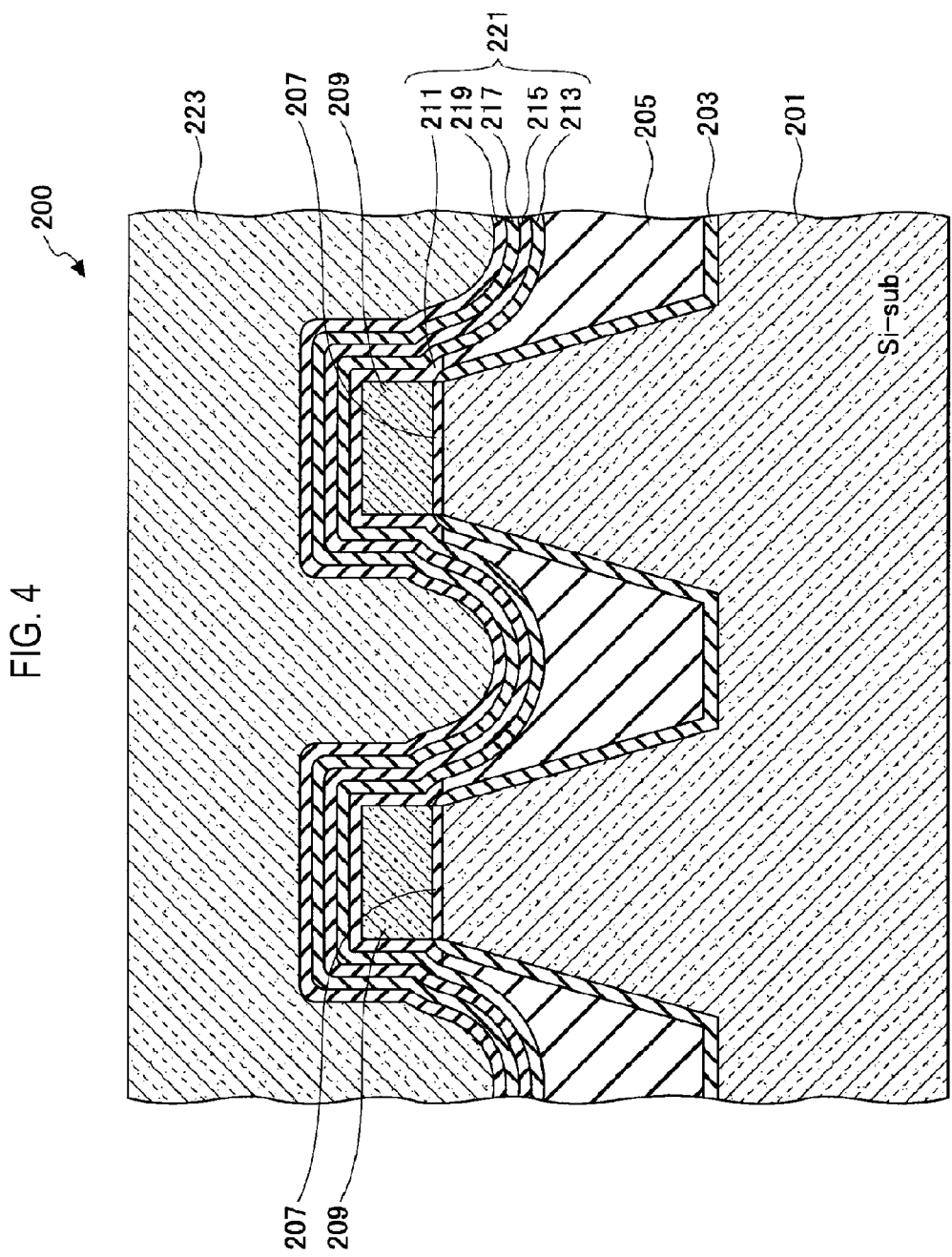
FIG. 4 is a sectional view showing a structure of a flash memory manufactured by a method of manufacturing a semiconductor device according to a second embodiment of the present invention.

Next, a nonvolatile memory manufacturing process, to which a semiconductor device manufacturing method according to embodiments of the present invention is applied, will be described with reference to FIGS. 4 to 8. FIG. 4 is a sectional view showing a schematic configuration of a flash memory which can be manufactured by applying the semiconductor device manufacturing method according to the embodiments of the present invention. The flash memory 200 has a laminate structure of NONON (silicon nitride film—silicon oxide film—silicon nitride film—silicon oxide film—silicon nitride film) as an interlayer capacitance film intervening between a floating gate electrode and a control gate electrode.

In the flash memory 200, concave portions (trench) are formed on a silicon substrate 201 by means of, for example, an STI (Shallow Trench Isolation) method. An element separation film 205 is buried in the concave portion via a liner silicon oxide film 203. A floating gate electrode 209, which is composed of polysilicon, is formed on a convex portion of the silicon substrate 201 (between two neighboring concave portions) via a tunnel insulation film 207. The floating gate electrode 209 that is a part for accumulating electric charge is covered up by an interlayer capacitance film 221. The interlayer capacitance film 221 has a first silicon nitride film 211, a first silicon oxide film 213, a second silicon nitride film 215, a second silicon oxide film 217 and a third silicon nitride film 219, which are layered from an inner portion to an outer portion in sequence. Further, a control gate electrode 223, which is composed of, e.g., polysilicon, is formed on the interlayer capacitance film 221, thereby constituting the flash memory 200. As clearly seen from FIG. 4, the first silicon nitride film 211 is configured to cover a surface of the floating gate electrode 209 and is not formed on the element separation film 205. Such a structure as described above allows the flash memory 200 to prevent interference between neighboring cells (specifically, electron transfer) and to show an excellent data holding characteristic. This will be described below.

Figure 5:
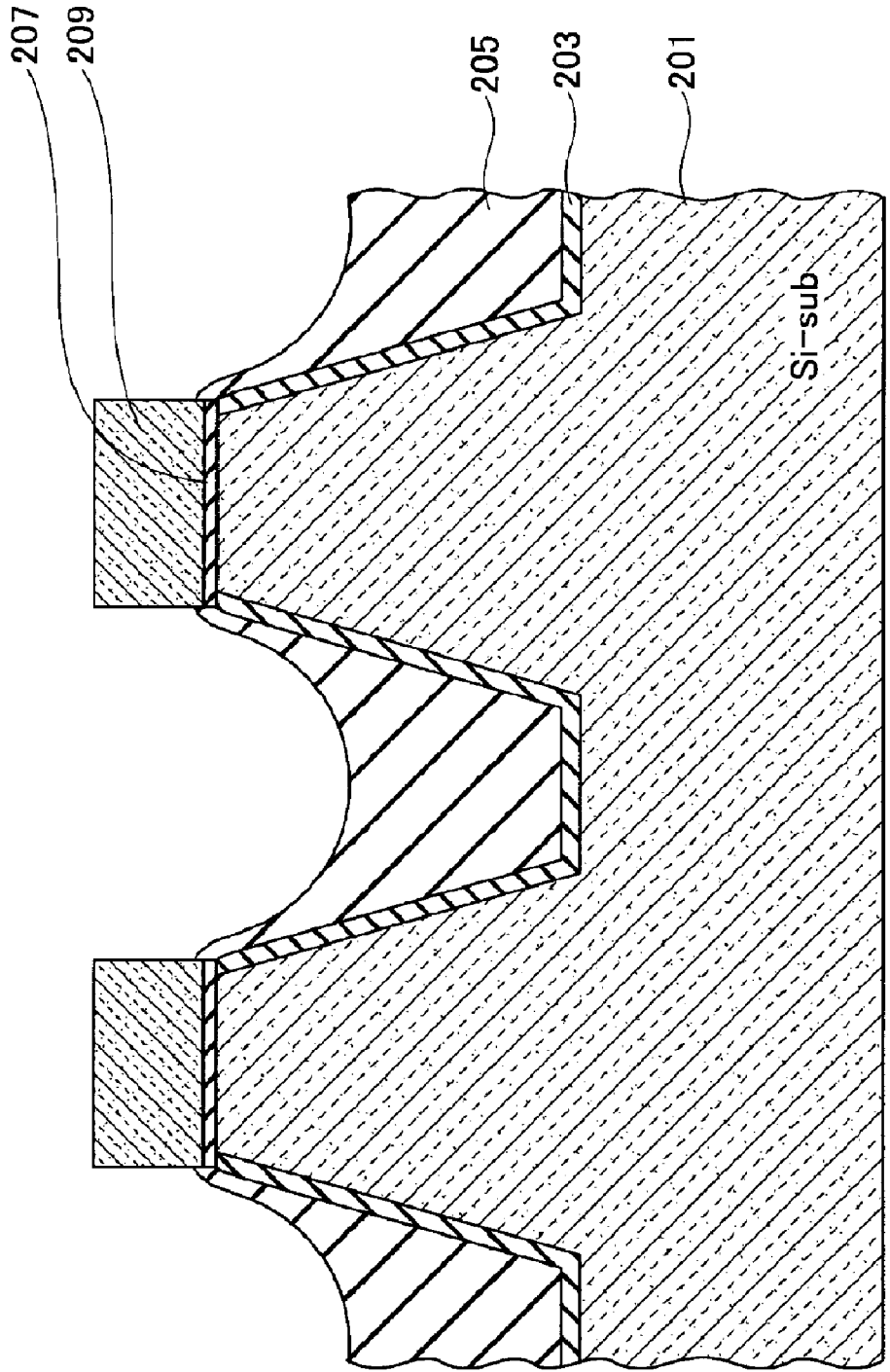
FIG. 5 illustrates a process of the method of manufacturing a semiconductor device according to a second embodiment of the present invention.

Next, the manufacturing process of the flash memory 200 will be described with reference to FIGS. 5 to 8. FIG. 5 shows a sectional structure of a main part of a wafer W that is subject to plasma nitridation. The floating gate electrode 209, which has polysilicon as a main component, is formed on the silicon substrate 201 via the tunnel insulation film 207. The tunnel insulation film 207 and the floating gate electrode 209 may be formed by means of known techniques such as a film forming process, a photolithography technology and an etching process.

An inner surface of the concave portion of the silicon substrate 201 is covered by the liner silicon oxide film 203. The element separation film 205 is buried in the concave portion that is covered by the liner silicon oxide film 203. The element separation film 205 demarcates an active region and a field region in the flash memory 200. The element separation film 205 may be formed in such a manner that silicon dioxide ($SiO_2$) film is formed by, for example, a HDP-CVD (High Density Plasma Chemical Vapor Deposition) method or an SOG (Spin-On-Glass) method, and then is wet-etched using dilute hydrofluoric acid, and thereafter is etched back.

Figure 6:
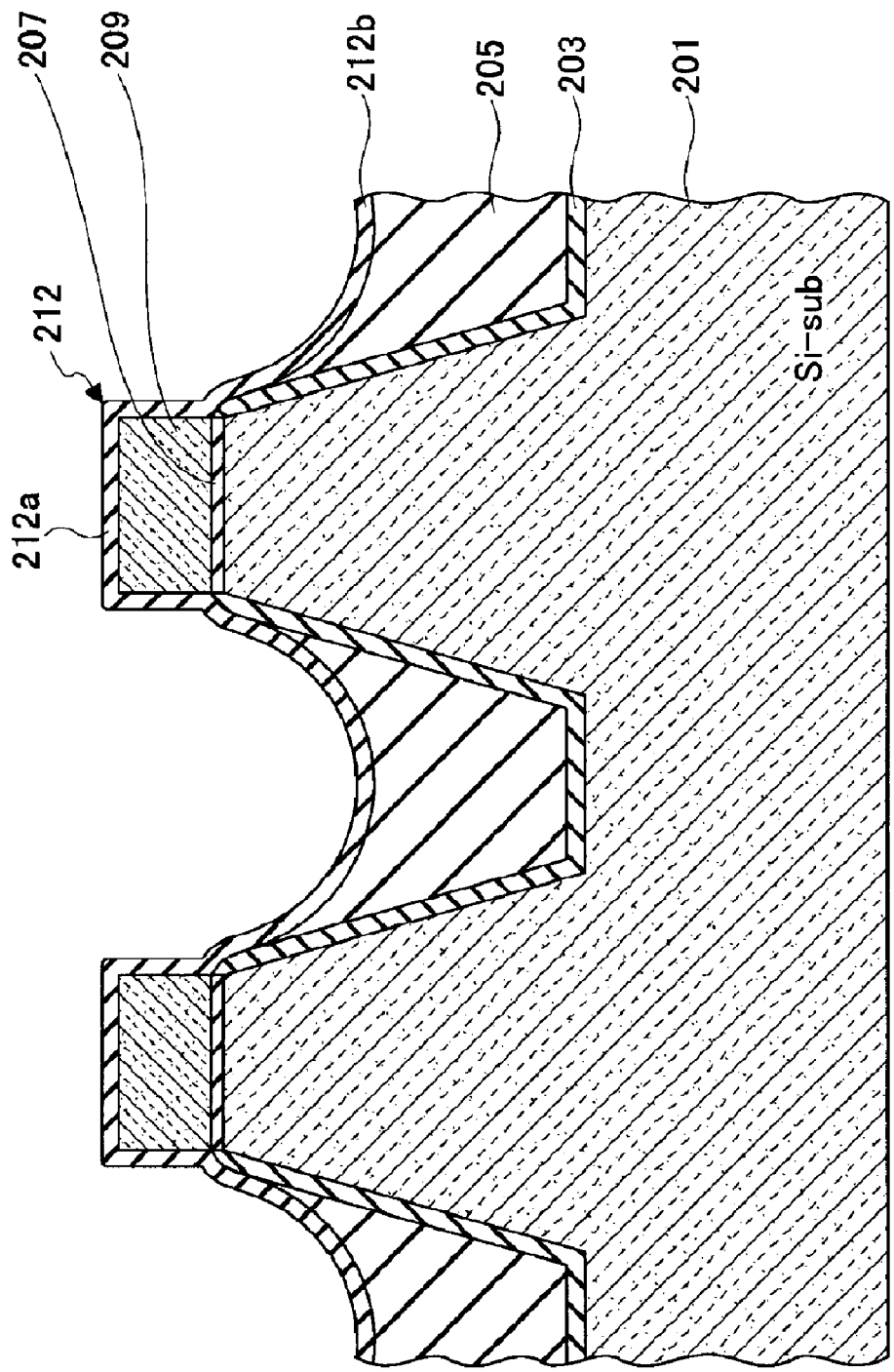
FIG. 6 illustrates a process following the process in FIG. 5.

Subsequently, the plasma nitridation is performed to polysilicon of the floating gate electrode 209 of the wafer W (the silicon substrate 201) that is in the state shown in FIG. 5. As shown in FIG. 6, a nitrogen-containing layer 212 is formed through the plasma nitridation. The nitrogen-containing layer 212 is formed on both a surface of the floating gate electrode 209 and a surface of the element separation film 205. In this case, a nitrogen-containing layer 212a of silicon nitride (SiN) is formed on the surface of the floating gate electrode 209 that comprises polysilicon as a main component. Further, a nitrogen-containing layer 212b of silicon oxynitride (SiON) is formed on the surface of the element separation film 205 composed of silicon dioxide ($SiO_2$). The plasma nitridation for forming the nitrogen-containing layer 212 may be performed by the same plasma processing apparatus and conditions as those in the first embodiment.

Figure 7:
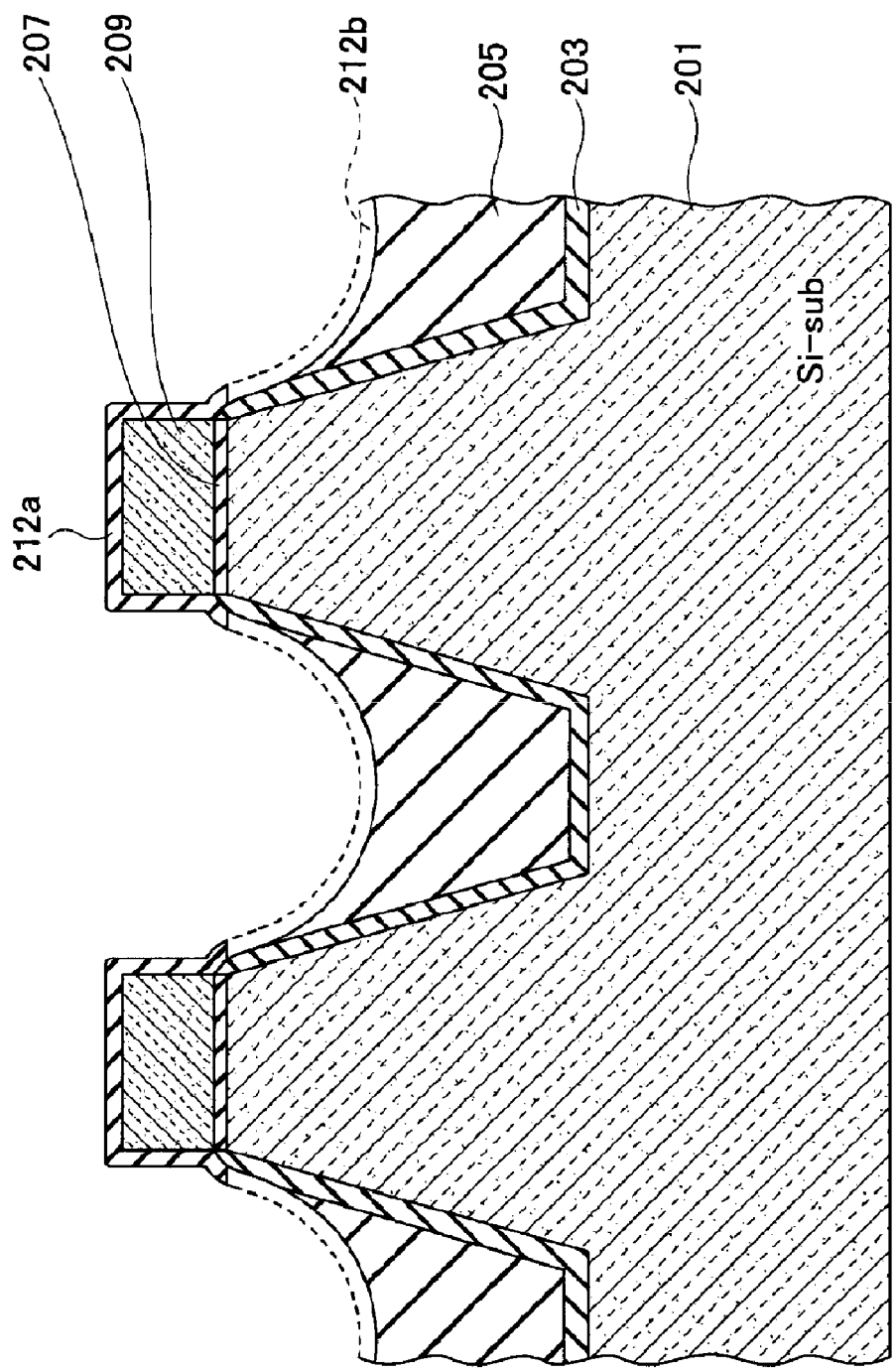
FIG. 7 illustrates a process following the process in FIG. 6.

Subsequently, selective etching is performed on the nitrogen-containing layer 212b. FIG. 7 shows the wafer W (the silicon substrate 201) after the selective etching. The selective etching may be performed under the same conditions as those in the first embodiment. The nitrogen-containing layer 212b formed on the surface of the element separation film 205 (a part indicated by dashed lines) is selectively removed through the selective etching process. However, the nitrogen-containing layer 212a on the surface of the floating gate electrode 209 is hardly removed but remains. The selective etching utilizes differences in solubility of silicon nitride (SiN) and silicon oxynitride (SiON) to etching liquid (dilute hydrofluoric acid). The remaining nitrogen-containing layer 212a goes into the first silicon nitride film 211 that is a part of the interlayer capacitance film 221 in the flash memory 200 (see FIG. 4).

Figure 8:
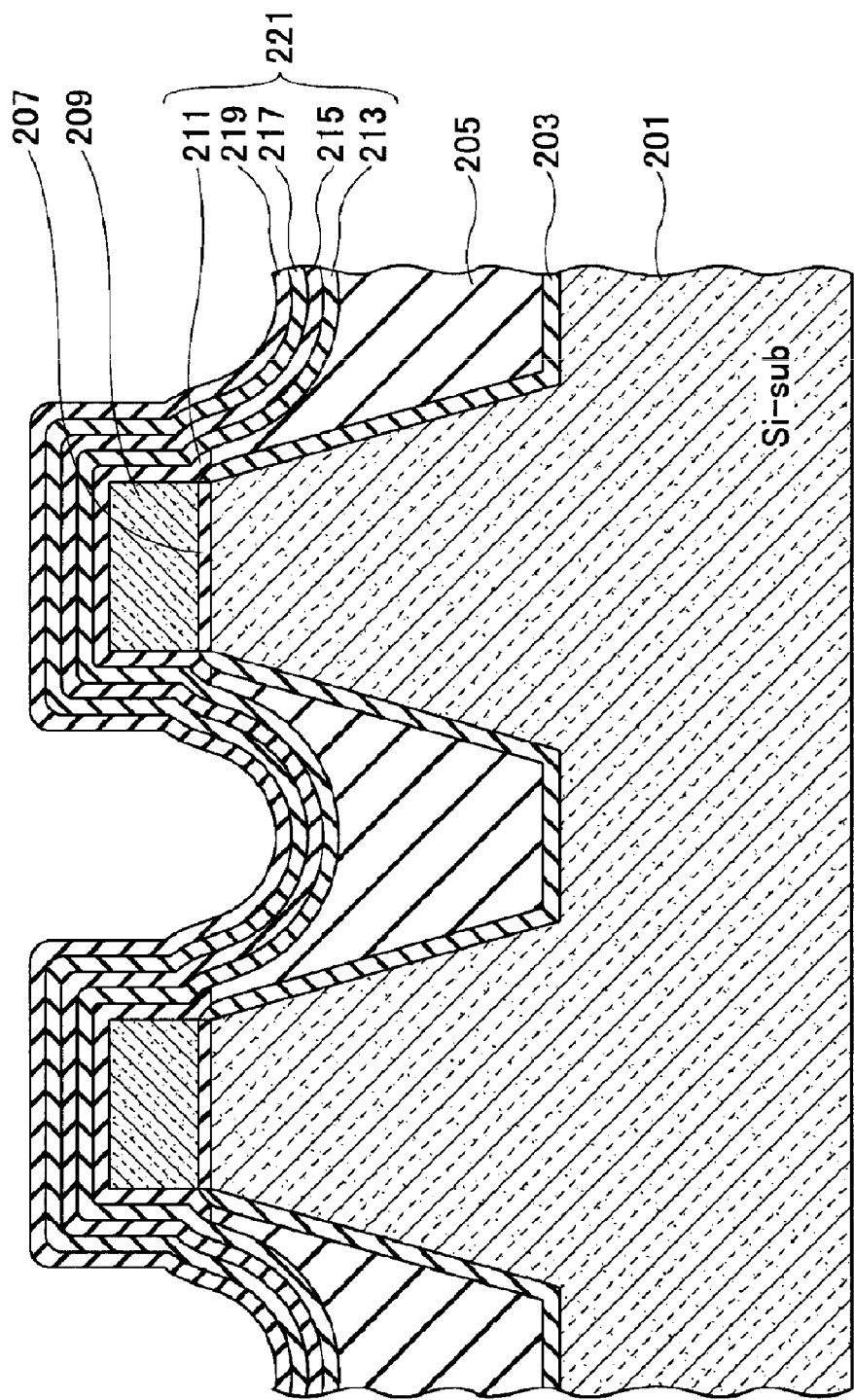
FIG. 8 illustrates a process following the process in FIG. 7.

After the selective etching, the first silicon oxide film 213, the second silicon nitride film 215, the second silicon oxide film 217 and the third silicon nitride film 219 are sequentially layered on both the first silicon nitride film 211 and the element separation film 205, thereby forming the interlayer capacitance film 221 shown in FIG. 8. The first silicon oxide film 213 may be formed as an HTO (High Temperature Oxide) film by means of, for example, a depressurization CVD method. The second silicon nitride film 215 may be formed by means of a depressurization CVD method which uses DCS (dichlorosilane) as a raw material. The second silicon oxide film 217 may be formed as an HTO (High Temperature Oxide) film by means of, for example, a depressurization CVD method. The third silicon nitride film 219 may be formed by means of, for example, a plasma nitriding method. Further, the control gate electrode 223 is formed on the third silicon nitride film 219 by means of a CVD method, a plasma CVD method, etc., thereby manufacturing the flash memory 200 configured as shown in FIG. 4.

Figure 9:
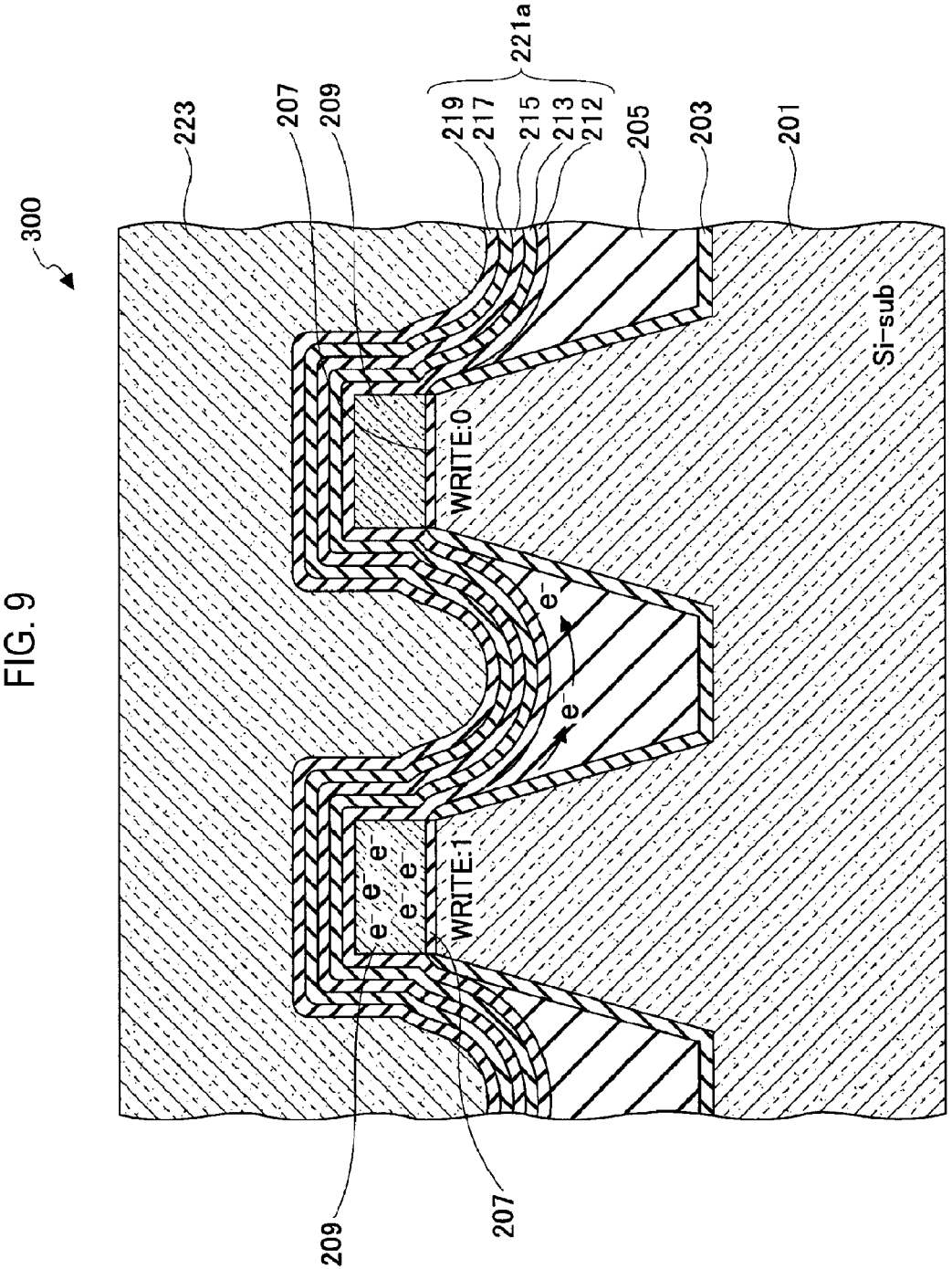
FIG. 9 is a sectional view showing the structure of a flash memory according to a comparative example.

Next, advantages of the flash memory 200, which is manufactured by the manufacturing method according to the embodiments of the present invention, will be explained with reference to a flash memory according to a comparative example, which is manufactured by another method. FIG. 9 schematically shows the structure of a flash memory 300 according to a comparative example. The manufacturing process for the flash memory 300 does not include a process for removing the nitrogen-containing layer 212b of silicon oxynitride (SiON) formed on the surface of the element separation film 205 after the plasma nitridation. For this reason, the flash memory 300 differs from the flash memory 200 shown in FIG. 4 in that an interlayer capacitance film 221a is formed on the whole nitrogen-containing layer 212. In the flash memory 300 shown in FIG. 9, the same reference numerals are denoted to the same parts as those of the flash memory 200 shown in FIG. 4 and descriptions thereof will be omitted.

The remaining unnecessary nitrogen-containing layer 212b (silicon oxynitride film) may serve as an electron transfer path, thereby causing interference between neighboring cells. Thus, there is a problem in that a data holding characteristic of the flash memory 300 deteriorates. That is, when a write status is different in the neighboring cells of the flash memory 300 (i.e., 0 or 1), electrons transfers via the nitrogen-containing layer 212 in contact with the element separation film 205 from a cell, wherein electric charge is injected into the floating gate electrode 209, toward another adjacent cell, wherein electric charge is not injected into the floating gate electrode 209, thereby deteriorating the data holding characteristic. In an example shown in FIG. 9, among two cells spaced apart from each other by the element separation film 205, one cell (a left-hand cell) is in a write status (WRITE: 1) where electrons are injected into the floating gate electrode 209, while the other cell (a right-hand cell) is in an erased status (WRITE: 0) where electrons are not injected into the floating gate electrode 209. If they are left for a long time in such a state, electrons flow from the cell in the write status toward the cell in the erased status via the nitrogen-containing layer 212 remaining between the element separation film 205 and the first silicon oxide film 213 as indicated by arrows in FIG. 9, thereby changing a threshold voltage of the cell in the write status (WRITE: 1). As a result, data cannot be held for a long time.

Figure 10A:
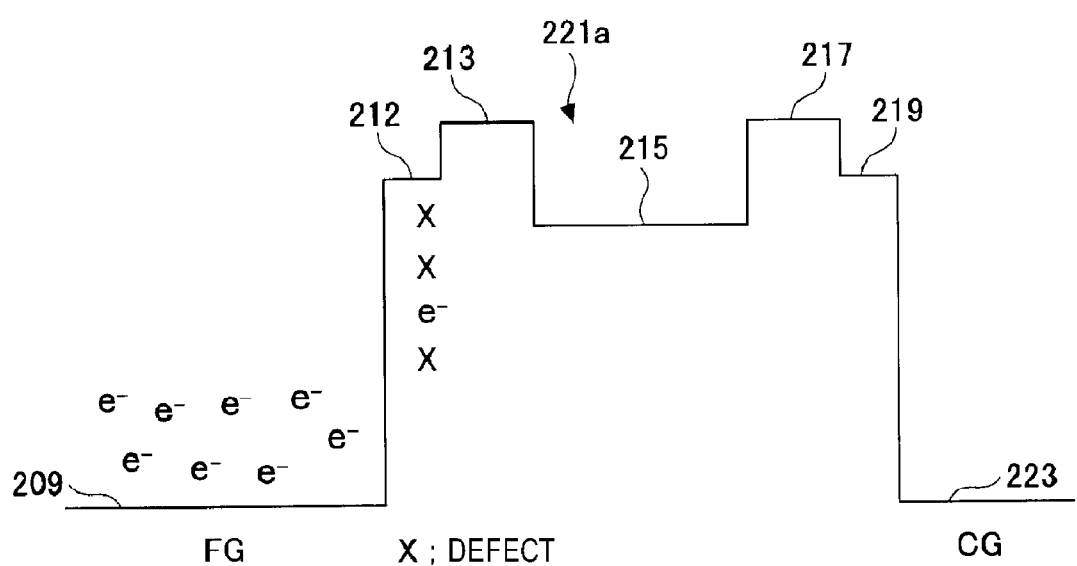
FIG. 10A illustrates a leak mechanism of electrons in a flash memory according to a comparative example.

The mechanism that causes such deterioration of the data holding characteristic can be explained in association with a barrier height of the interlayer capacitance film 221a. FIG. 10A schematically shows a band diagram between the floating gate electrode 209 and the control gate electrode 223 in the flash memory 300 according to a comparative example. Since a high barrier exists between the floating gate electrode 209 and the control gate electrode 223 due to, in particular, the first silicon oxide film 213 of the interlayer capacitance film 221a, it is difficult for electrons to tunnel through the interlayer capacitance film 221a, that is, leakage of electrons through the interlayer capacitance film 221a is difficult. However, the nitrogen-containing layer 212, which is formed by the plasma nitridation and is in contact with the floating gate electrode 209, has a relatively small energy band gap. This just provides a relatively low barrier to the floating gate electrode 209. Thus, electrons somewhat leak from the floating gate electrode 209 into the nitrogen-containing layer 212. And, it appears that electrons move through electrical defects in the nitrogen-containing layer 212 and transfer to an adjacent cell.

By contrast, in the flash memory 200 (FIG. 4) manufactured by the manufacturing method according to the embodiments of the present invention, the nitrogen-containing layer (the silicon oxynitride film; this is indicated by reference numeral 212b in FIG. 6) on the element separation film 205 is removed by etching and thus the first silicon nitride film 211 terminates around the floating gate electrode 209. Accordingly, electrons are not allowed to transfer along the nitrogen-containing layer on the element separation film 205, thereby preventing the interference between neighboring cells. In addition, as shown in FIG. 10B, a high barrier caused by the first silicon oxide film 213 directly acts relative to the floating gate electrode 209 in the flash memory 200, thereby sufficiently reducing leak of electrons (tunneling) from the floating gate electrode 209 to the second silicon nitride film 215.

As described above, according to the manufacturing method according to the embodiments of the present invention, an excellent data holding characteristic can be achieved and the reliability of a flash memory can be enhanced by preventing the interference between neighboring cells.

The configuration, functions and effects other than the foregoing second embodiment is the same as those of the first embodiment.

While the present invention has been described with reference to the foregoing embodiments of the present invention, the present invention should not be limited to the foregoing embodiments and may include various modifications. For example, in the foregoing embodiments, a plasma processing apparatus of an RLSA method or an ICP method is used in the process for forming the first silicon nitride film (nitrogen-containing layer). However, a plasma processing apparatus of any other methods may be used insofar as an electron temperature of generated plasma is not less than 0.7 eV and not more than 2 eV at a surface of a wafer. For example, a plasma processing apparatus of any other method such as an electron cyclotron resonance (ECR) plasma, a magnetron plasma and a surface wave plasma (SWP) may be used.

Further, while the interlayer capacitance film 221 has an NONON structure in the second embodiment, it should not be limited thereto. For example, the present invention may be applied to manufacturing a flash memory having an NONO structure from an inner portion (a side of a floating gate electrode) as well.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor device, wherein an element separation film containing oxygen demarcates a field region and an active region, the semiconductor device having an electrode layer and a nitrogen-containing layer being in contact with the electrode layer in the active region, the method comprising:
   plasma nitriding to form a nitrogen-containing layer of a silicon nitride film on a surface of the electrode layer and a nitrogen-containing layer of a silicon oxynitride film on a surface of the element separation film respectively by applying a plasma of a processing gas including an argon gas and a nitrogen-containing gas to exposed surfaces of the electrode layer and the element separation film, the electrode layer comprising polysilicon as a main component and the element separation film comprising silicon oxide as a main component; and
   selectively etching to selectively remove the nitrogen-containing layer of the silicon oxynitride film formed on the surface of the element separation film while leaving the nitrogen-containing layer of the silicon nitride film formed on the surface of the electrode layer,
   wherein in said selectively etching, the nitrogen-containing layer of the silicon oxynitride film is selectively removed by wet etching using a dilute hydrofluoric acid solution having a concentration ranging from not less than 0.07% to not more than 1%.

2. The method of claim 1, wherein a nitrogen concentration of the nitrogen-containing layer formed on the electrode layer by said plasma nitriding is in a range of not less than 35 atomic % and not more than 45 atomic %.

3. The method of claim 1, wherein the electrode layer is a floating gate electrode of a nonvolatile memory and the silicon nitride film constitutes a part of an interlayer capacitance film intervening between the floating gate electrode and a control gate electrode.

4. The method of claim 1, wherein said wet etching is performed just after said plasma nitriding and at least before a subsequent process accompanying heating.

5. The method of claim 1, wherein a processing time in said wet etching is in a range of not less than 10 seconds and not more than 300 seconds.

6. The method of claim 5, wherein said plasma nitriding is performed under the following conditions: a pressure in a range of not less than 13.3 Pa and not more than 400 Pa; a flow rate ratio of the nitrogen gas to the processing gas in a range of not less than 1% and not more than 20%; a processing temperature in a range of not less than 200° C. and not more than 600° C.; and a processing time in a range of not less than 30 seconds and not more than 240 seconds.

7. The method of claim 1, wherein a volumetric flow rate ratio of the nitrogen gas to the processing gas is in a range of not less than 1% and not more than 90%.

8. The method of claim 1, wherein a pressure in said plasma nitriding is in a range of not less than 1.3 Pa and not more than 667 Pa.

9. The method of claim 1, wherein the plasma in said plasma nitriding is generated by using a planar antenna having a plurality of slots and irradiating a microwave to the processing gas.

10. The method of claim 1, wherein the plasma in said plasma nitriding is generated using one of an inductively coupled plasma method, an electron cyclotron resonance method, a magnetron plasma method and a surface wave plasma method.

* * * * *